(12) United States Patent
Lavi et al.

(10) Patent No.: US 8,647,437 B2
(45) Date of Patent: Feb. 11, 2014

(54) APPARATUS, TOOL AND METHODS FOR DEPOSITING ANNULAR OR CIRCULAR WEDGE COATINGS

(75) Inventors: Moshe Lavi, Nofit (IL); Dario Cabib, Timrat (IL)

(73) Assignee: CI Systems (Israel) Ltd., Migdal HaEmek (IL)

( * ) Notice: Subject to any disclaimer, the term of this patent is extended or adjusted under 35 U.S.C. 154(b) by 682 days.

(21) Appl. No.: 12/790,913

(22) Filed: May 31, 2010

(65) Prior Publication Data
US 2011/0293835 A1    Dec. 1, 2011

(51) Int. Cl.
*C23C 16/04*    (2006.01)
(52) U.S. Cl.
USPC ............................ 118/721; 118/730; 118/504
(58) Field of Classification Search
USPC ............. 118/721, 730, 504, 50, 726, 723 EB, 118/723 VE; 219/121.15, 121.19; 204/298.11, 298.15; 269/56, 57; 156/345.3, 345.55
See application file for complete search history.

(56) References Cited

U.S. PATENT DOCUMENTS

| | | | |
|---|---|---|---|
| 2,432,950 A | | 12/1947 | Turner et al. |
| 3,617,331 A | | 11/1971 | Illsley et al. |
| 4,034,704 A | * | 7/1977 | Wossner et al. ............... 118/730 |
| 4,816,133 A | * | 3/1989 | Barnett ..................... 204/298.06 |
| 5,795,448 A | | 8/1998 | Hurwitt et al. |
| 6,475,557 B1 | | 11/2002 | Mori et al. |
| 2003/0132107 A1 | | 7/2003 | Krauss et al. |
| 2006/0070877 A1 | * | 4/2006 | Tilsch et al. ............. 204/298.27 |
| 2010/0272893 A1 | * | 10/2010 | Chang et al. ............... 427/255.5 |

FOREIGN PATENT DOCUMENTS

JP         2000-039514         2/2000

OTHER PUBLICATIONS

Thelen, "Circularly Wedged Optical Coatings, I. Theory", Applied Optics, 1965, pp. 977-981, vol. 4, No. 8.
J.H. Apfel, "Circularly Wedged Optical Coatings, II. Experimental", Applied Optics, 1965, pp. 983-985, vol. 4, No. 8.
EP Search Report, Sep. 14, 2011.

* cited by examiner

*Primary Examiner* — Laura Edwards
(74) *Attorney, Agent, or Firm* — Nathan & Associates Patent Agents Ltd.; Menachem Nathan

(57) ABSTRACT

An apparatus for depositing annular or circular wedge coatings with arbitrary dependence of thickness versus position includes a coating tool in which at least one substrate is disposed in a line of sight arrangement vs. least one deposition source, each substrate having an axis of symmetry and associated with a single mask having an aperture and positioned between the substrate and the least one deposition source, the mask and the substrate arranged to perform a relative rotation around a common axis to follow a law of motion which results in the deposition of a coating with a desired law of variation of thickness vs. position on the circumference of the substrate. The relative rotation is imparted by a motor. In embodiments in which there are a plurality of substrates and associated single masks, the substrates are positioned on a planet carrier independently rotatable by another motor.

15 Claims, 10 Drawing Sheets

(a)

(b)

APPARATUS, TOOL AND METHODS FOR DEPOSITING ANNULAR OR CIRCULAR WEDGE COATINGS

FIELD AND BACKGROUND OF THE INVENTION

Embodiments of this invention relate generally to systems and methods for deposition of thin films and more particularly to systems and method for depositing annular (or "circular") wedged coatings (referred to in general as "AWC"s) for circularly variable filters (CVF). A CVF is an optical element of circular shape which includes a circular substrate coated with layers of dielectric materials to produce a multi-layer interference coating which has a variable thickness around the circle (i.e. an AWC). The substrate is typically a solid disk made of a semiconductor (germanium, silicon, zinc selenide, zinc sulfide, etc.), sapphire, glass or quartz. A typical CVF is shown diagrammatically in FIG. 1. Its thickness varies from a small value at 102 to a large value at 104 on a substrate 106. A CVF can serve as a narrow band-pass filter, such that a central transmitted wavelength within a predefined wavelength range varies linearly around the substrate circumference. AWCs and CVFs are exemplarily described in A. Thelen, "Circularly Wedged Optical Coatings, I. Theory", Applied Optics, Vol. 4, No. 8 (1965), pp. 977-981 and in J. H. Apfel, "Circularly Wedged Optical Coatings, II. Experimental", Applied Optics, Vol. 4, No. 8 (1965), pp. 983-985. Such filters have been used for many years in spectrometers and spectroradiometers.

The deposition of AWCs is normally performed in vacuum chambers using known thin film deposition techniques (e.g. evaporation or sputtering). Some AWC/CVF coating tools use "planetary systems" in which a plurality of substrates ("planets") are mounted on a planet carrier which rotates in a first rotation (or simply "rotation") around a central (first) axis. Two masks are positioned between each substrate and dielectric material coating targets or "sources". Each substrate and its respective masks may be rotated in a second rotation around a second axis which is displaced radially from and parallel to the first axis. The first (planet carrier) rotation is needed to insure good control of the thickness function itself, i.e. to cancel out effects of non-uniform deposition rates in different parts of a coating chamber. The second rotation (which includes a relative rotation between masks and substrate) is needed to achieve the variable layer thickness of the coating around the substrate circumference. In most planetary coating tools, the mechanical setups are such that the various rotations are imparted by a single motor using fixed shape cams or fixed gears. This limits the rotation speeds of the various parts of the system to fixed ratios or time profiles. Consequently, a tool used for the production of a single AWC/CVF, or for the simultaneous production of a plurality of AWC/CVFs on different substrates is suitable for only one type of AWC/CVF. If a different type of AWC/CVF has to be produced, a mechanical change has to be introduced in the tool or a different tool must be used. As used herein with reference to types of coatings, "different" refers to different laws of variation of thickness vs. position on the circumference of the substrate, described by different functions. Such functions may include linear functions with different slopes, a non-linear function such as logarithmic, sinusoidal or power function, or any other analytical or tabulated function.

In view of the disadvantages of existing planetary AWC/CVF coating tools, there is a need for and it would be advantageous to have a coating tool which will render the production of different types of AWC/CVF structures less expensive and less time consuming It would be desirable to avoid the need to build different coating tools and the need to dismantle and re-mount a coating tool in a coating chamber in order to produce a new type of AWC/CVF structures, or when testing of coating performance points to unsatisfactory tool design or production.

No known planetary coating tool or system includes these features, and none has the capability to continuously yield high quality, thin film AWC/CVF structures as is possible with the apparatus of the present invention. While prior art patents and known commercial devices may disclose or suggest features analogous to some of the features disclosed herein, all are simply lacking in one regard or another. Nothing in these prior art patents and known commercial devices suggests the present inventive combination of component elements arranged and configured as disclosed and claimed herein. Prior devices simply do not provide the benefits attendant with embodiments of the invention disclosed herein.

SUMMARY OF THE INVENTION

Embodiments of the invention disclose a planetary coating tool, apparatus and methods for depositing AWCs with any desirable variation of thickness around the circumference of a substrate, using a single mask per substrate, provided this variation is monotonously increasing or decreasing with position on this circumference. The single mask and the substrate are imparted a relative rotation there-between by a motor separate from any other motor which may be used for planetary rotation. The mask has one or more apertures of a given shape through which material being deposited or coated reaches the substrate. The relative motion is controlled such that an AWC with a desired thickness profile is formed on the substrate. Advantageously, the coating tool does not require a mechanical change in the tool itself for the production of different types of AWCs.

Mask rotation can be performed according to a desired design or program. In some embodiments, the rotation is performed once in one direction or "one-way" (for example clockwise relative to the substrate), through an angle equal to the window angle. In some embodiments, the mask rotation includes one clockwise and one counter clockwise rotation (i.e. a see-saw or pendulum motion) through an angle equal to the window angle. In some embodiments, the pendulum motion is repeated once or more times. Dwell (motion stop) may be applied at different times to allow uniform thickness deposition on unmasked portions of the substrate.

In accordance with an embodiment of the invention, there is provided a coating tool for fabrication of an annular or a circular wedged coating on a substrate, the tool comprising a single mask having an aperture and positioned coaxially with the substrate to enable a relative rotation between the single mask and the substrate around a common first rotation axis, the aperture configured to allow material ejected from at least one deposition source to reach a predetermined section of the substrate and be deposited thereon, the relative rotation being imparted by a first motor and controllable to provide an annular or circular wedged coating with a desired law of thickness variation vs. position on a substrate circumference.

In an embodiment, the coating tool further comprises a planet carrier for carrying and rotating the substrate around a second rotation axis, the planet carrier rotation being imparted by a second motor and being independent of the relative rotation between the single mask and the substrate.

In an embodiment, the relative rotation extends over a single half cycle.

In an embodiment, the relative rotation extends over a single full cycle.

In an embodiment, the relative rotation extends over a plurality of full cycles.

In an embodiment, the mask is a butterfly mask.

In an embodiment, the law of thickness variation is linear.

In an embodiment, the law of thickness variation is non-linear.

In an embodiment the law of thickness variation is a continuous function of position.

In an embodiment the law of thickness variation is a discontinuous function of position.

In accordance with an embodiment of the invention, there is provided an apparatus for fabrication of an annular or circular wedged coating on a substrate comprising a coating chamber and a coating tool which includes a single mask having an aperture and positioned coaxially with the substrate to enable a relative rotation between the single mask and the substrate around a common first rotation axis, the aperture configured to allow material ejected from at least one deposition source to reach a predetermined section of the substrate and be deposited thereon, the relative rotation being imparted by a first motor and controllable to provide an annular or circular wedged coating with a desired law of thickness variation vs. position on a substrate circumference.

In an embodiment, the apparatus further comprises a planet carrier for carrying and rotating the substrate around a second rotation axis, the planet carrier rotation being imparted by a second motor and being independent of the relative rotation between the single mask and the substrate.

In accordance with an embodiment of the invention, there is provided a method for fabricating an annular or circular wedged coating on a substrate comprising the steps of: providing a coating tool comprising a single mask having an aperture and positioned coaxially with the substrate such as to enable a relative rotation between the single mask and the substrate around a common first rotation axis, the aperture configured to allow material ejected from at least one deposition source to reach a predetermined section of the substrate and be deposited thereon; and performing the relative rotation, thereby depositing on the substrate an annular or circular wedged coating with a desired law of thickness variation vs. position on a substrate circumference.

BRIEF DESCRIPTION OF THE DRAWINGS

Particular embodiments in accordance with the invention will be described, by way of example only, and with reference to the accompanying drawings in which like reference numbers are used to denote like elements or parts, and in which:

FIG. 2b shows an enlarged view with details of the embodiment of FIG. 2a;

FIG. 3b shows enlarged details of the embodiment of FIG. 3a;

FIG. 7a shows a linear thickness function, useful for the classic CVF production;

FIG. 7b shows the mask motion function $\alpha(t)$ for the linear example of FIG. 7a;

FIG. 8a shows a stepwise thickness function for a number of discrete filters to be deposited on the substrate;

FIG. 8b shows a mask motion function $\alpha(t)$ for the stepwise example of FIG. 8a.

DETAILED DESCRIPTION OF THE INVENTION

Figure 1:
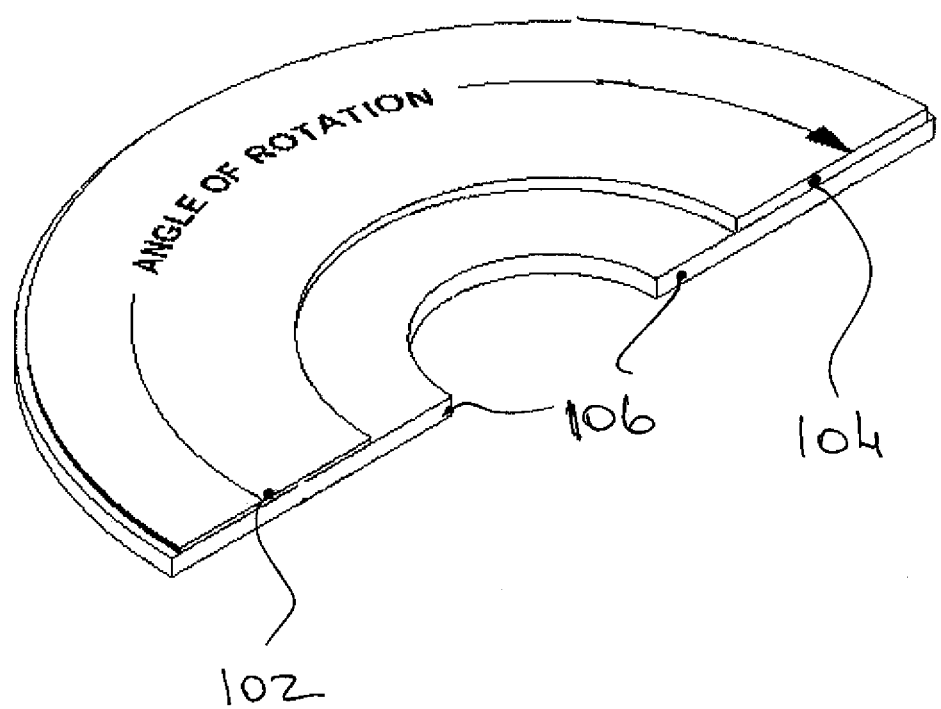
FIG. 1 shows schematically a CVF.
Figure 2A:
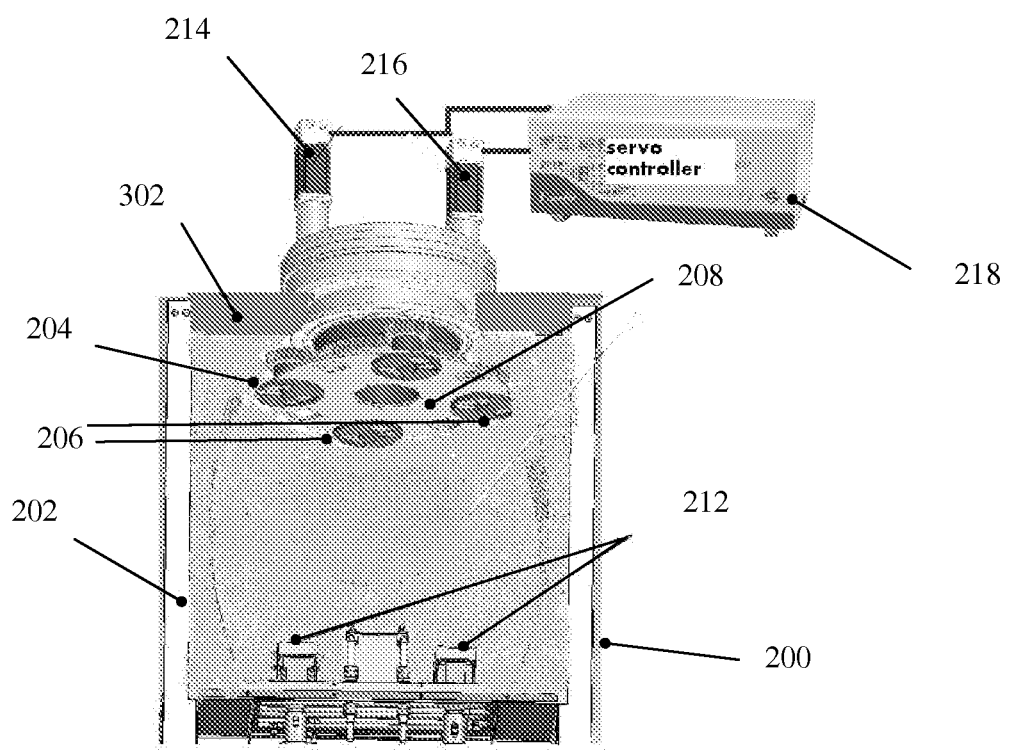
FIG. 2a shows a general view of an embodiment of an apparatus of the invention.
Figure 2B:
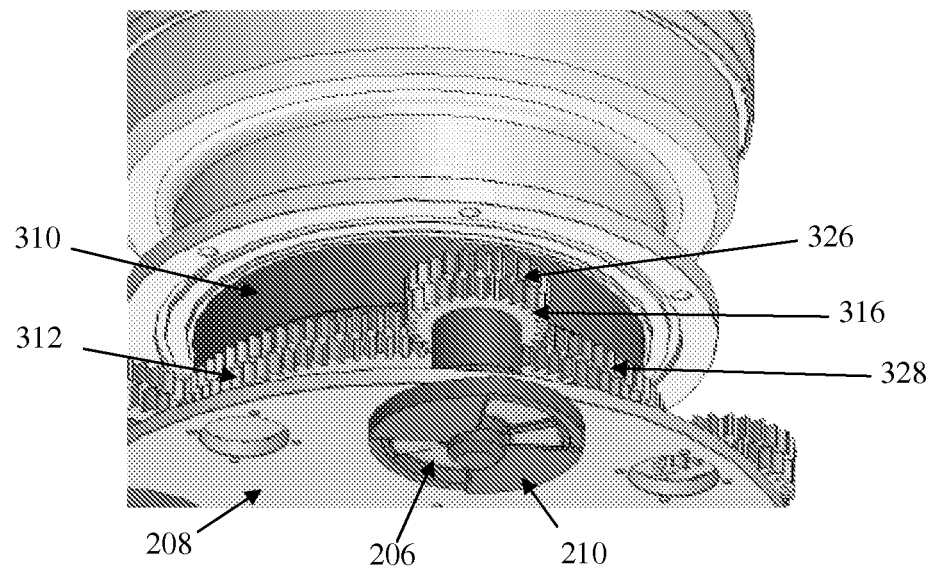
Figure 3A:
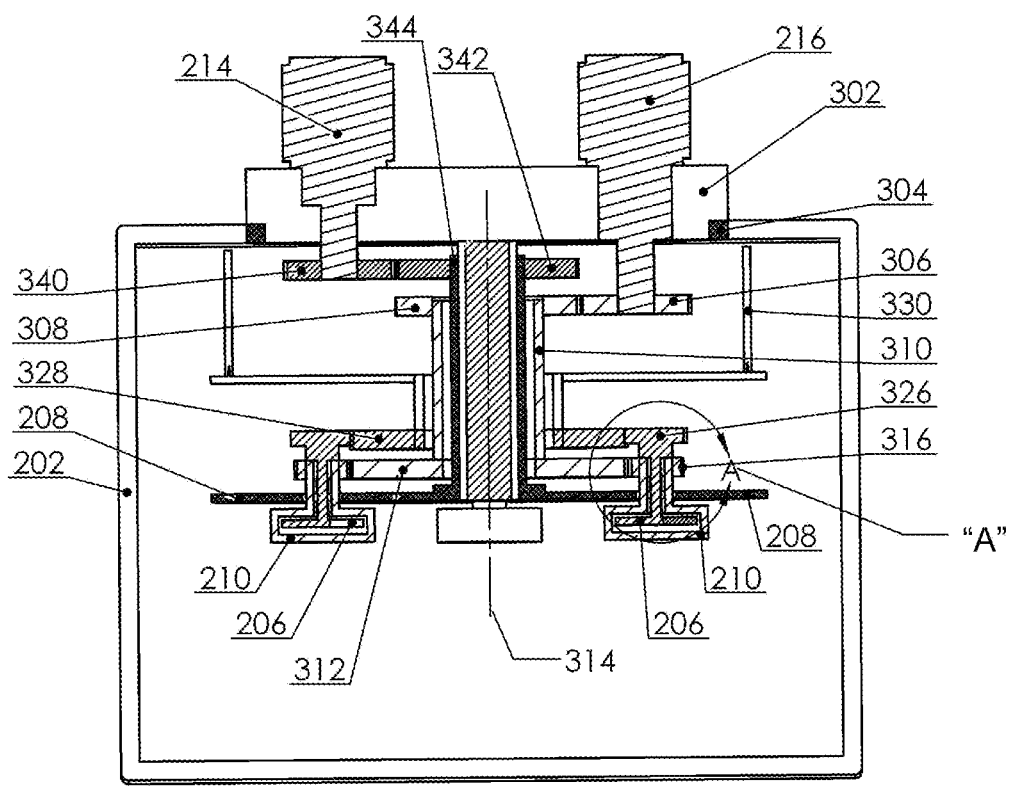
FIG. 3a shows internal details of the embodiment of FIG. 2a in cross section.
Figure 3B:
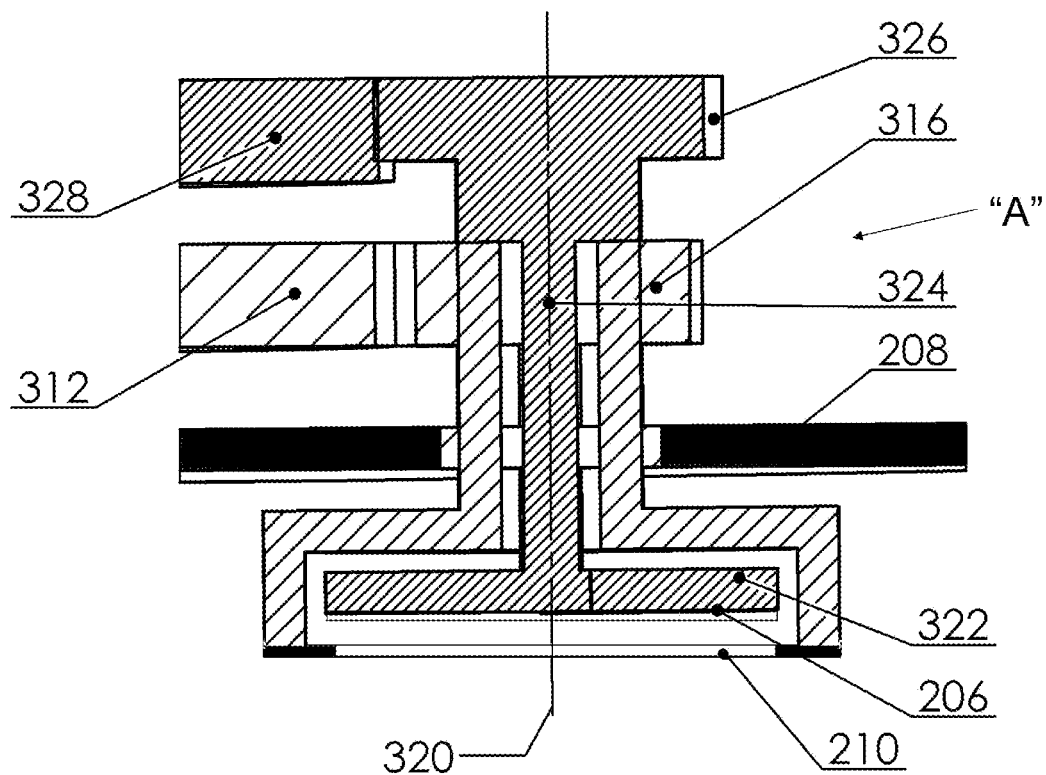
Figure 4:
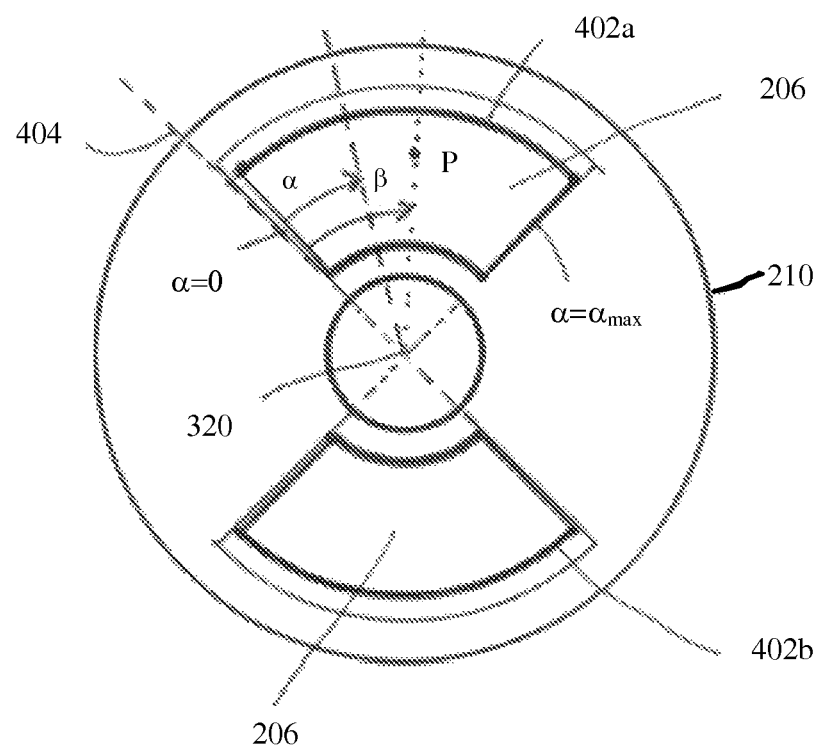
FIG. 4 shows details of a substrate-mask assembly in the embodiments of FIGS. 2 and 3.

FIGS. 2-4 show various views of an embodiment 200 of an apparatus of the invention. FIG. 2a shows in perspective and cross section of apparatus 200, while FIG. 2b shows an enlarged view of parts of FIG. 2a. In these figures, apparatus 200 is shown including a vacuum chamber 202 having a coating tool 204 for depositing AWCs on one or more substrates 206. The embodiment in FIG. 2a shows exemplarily four such substrates arranged on a planet carrier 208. The substrates are preferably round disks, made of materials well known in the art. Each substrate has a respective single mask 210 (also shown in FIGS. 3a, 3b and 4) associated therewith, through which it faces one or more coating targets (deposition sources) 212. The mask is generally a thin circular disc, made of a solid material, e.g. metal, plastic, ceramic, composite or similar materials. The mask and substrate are "coaxial" in the sense that they share a common axis of symmetry (see. e.g. axis 320 in FIG. 3b). In some ways, a mask-substrate assembly herein may resemble the arrangement in U.S. Pat. No. 3,617,331 to Illsley et al., except that Illsley et al. always use two masks, while embodiments of the invention disclosed herein always use a single mask. Each substrate and its associated mask form a substrate-mask assembly. The coating target(s) is/are positioned in the vacuum chamber in well known arrangements relative to the substrates and used as source of the materials deposited on the substrates to form the AWC. In the particular arrangement shown in FIG. 2, the coating tool is mounted to the top of the vacuum chamber while the coating targets are positioned at the bottom of the vacuum chamber.

FIGS. 3a and 3b show internal details of the apparatus and in particular of the mechanism which enables the single mask rotation. Some of these details can also be seen in FIG. 2b. In the embodiment shown in FIGS. 2 and 3, the apparatus further includes a first motor 214 rotatably coupled to the planet carrier to impart the planet carrier a first rotation and a second motor 216 rotatably coupled to each mask and operative to impart each mask a second rotation. The mask is rotated relative to the substrate, which may itself be rotated by the first motor. Hereinafter, "single mask rotation" refers to this relative rotation between a single mask and its respective substrate, which occurs around the common axis of symmetry. Consequently, "mask rotation" as used herein should not be construed that only the mask rotates. The mask rotation can follow a prescribed law of motion to facilitate deposition of an AWC with a desired law of variation of thickness vs. position on the circumference of the substrate. The first and second motors operate independently of each other. Each motor is controllable through one or more controllers 218 external to the vacuum chamber. Instructions necessary to obtain the prescribed law of motion can be programmed into the controller(s).

Motor 216 is supported by a feedthrough plate 302 attached to the vacuum chamber and sealed at its circumference by a seal 304. Motor 216 is coupled through a mask pinion 306 to a master mask gear 308 which in turn is fixedly attached through a hollow shaft 310 to a mask sun gear 312. Mask sun gear 312 rotates around an axis 314 and is engaged with a mask gear 316 which rotates single mask 210 around common axis 320. Further, substrate 206 is attached to a holder 322 positioned on planet carrier 208 and is coupled through a shaft 324 to a planet (substrate) gear 326 which is engaged by a substrate sun gear 328. Substrate sun gear 328 is fixedly attached to a substrate sun gear holder 330. In a planetary system as shown, substrate 206 is rotatable around axis 320 by the rotation imparted to the planet carrier, since this rotation causes planet gear 326 to rotate through its engagement with substrate sun gear 328. The rotation of carrier 208 is caused by motor 214, which is also supported by feedthrough plate 302 and is coupled through a planet carrier pinion 340 to a planet carrier gear 342, which in turn is fixedly attached through a hollow shaft 344 to the planet carrier.

While in the embodiment shown in FIGS. 2 and 3 there are a plurality of substrates positioned on a planet carrier rotatable by motor 214, it is to be understood that in other embodiments there may be a single substrate mounted coaxially with a single mask as described above. In some such embodiments, the single mask rotation may be imparted by motor 216 while the substrate is stationary, thereby removing the need for motor 214. Obviously, in this case the planetary motion which ensures uniformity is not performed.

FIG. 4 shows details of a substrate-mask assembly. In this embodiment, a mask 210 is shown to have two diametrically opposed quarter circle apertures (also referred to as "windows") 402a and 402b. A mask of this type is referred to henceforth as a "butterfly" mask. The apertures shown have an angle $\gamma$ of 90°, but it is to be understood that $\beta$ may be smaller or larger than 90°. In some embodiments, a mask may have a single aperture with an angle $\gamma$ between 0 and 180°. In yet other embodiments, a mask may have a plurality of apertures. Respective portions of a substrate (or two separate substrates) 206 are shown through these apertures. The portions may have the same areas and shapes as the apertures or may have larger areas.

Substrate sun gears 328 and planet gears 326 insure that the multiple substrates (exemplarily the four shown in FIG. 2) rotate together at the same instantaneous rate, each around its own axis 320 (this rate being capable of changing with time), but that planet carrier 208 rotates independently at its own rate for overall uniformity of coating. This independency insures that the thickness function of the coating can be varied around the substrates from a production run to the next without having to change the coating tool in the chamber, to dismantle it and re-mount a different tool, etc. This advantage is achieved because the angular rate of rotation of all the masks, or masks with respect to substrates, being controlled electronically, can follow any time function, constant or not constant, and can be completely independent of the "planets carrier" rotation rate.

In use, motor 214 is controlled by the controller to rotate the planet carrier in a prescribed rotation, normally at a constant rate. Motor 216 is controlled by the controller to provide a relative rotation to each mask-substrate assembly in the required prescribed law of motion. Exemplary rotations are described in more detail below. In particular, the mask rotations may follow repeated back and forth movements (clockwise—counterclockwise or "pendulum" motion). Dwell (motion stop) periods may be applied at desired points to provide uniform film thickness increases.

Examples of Prescribed Motions—Time Profiles

The coating tool, apparatus and methods disclosed herein allow to build any predetermined film thickness profile on a substrate with a single mask, either through a single mask movement covering the substrate from one end to the other (half cycle), or through repeated mask movements back and forth covering the substrate from one end to the other and back (full cycles), provided that the thickness function versus position on the substrate is monotonously increasing or decreasing along the substrate circumference. The mask position versus time function with respect to the substrate which provides the desired thickness profile function on the substrate is obtained by inverting the function obtained by dividing the thickness profile function by the film deposition rate (in the case of half cycle) or by dividing the thickness profile function by twice the number of full cycles in the case of repeated back and forth mask movements.

The description next is based on FIG. 4. A dashed line 404 is the origin of the rotation angle $\alpha$ of the mask with respect to the substrate (i.e. at 404 $\alpha$=0). The axis of rotation of the mask with respect to the substrate (axis 320) is perpendicular to the plane of the paper and passing through the mask center. The stream of material being deposited on the substrate is also perpendicular or nearly perpendicular to the plane of the paper and originating from the side of the reader, so that the mask is interposed between the substrate and the origin of the stream. At $\alpha$=0 the substrate is completely uncovered by the mask and exposed to the coating deposition. The thickness of the material being deposited on any point on the substrate as function of position at the end of the process is designated as h($\beta$), where $\beta$ is defined below. The film deposition rate, defined as the film thickness deposited on the substrate per unit time is assumed to be constant and designated as "r".

After the film deposition starts, the mask starts rotating from line 404 in a clockwise direction, covering a larger and larger portion of the substrate as time goes on, i.e. angle $\alpha$ increases from 0 to $\alpha_{max}$ (which also coincides with the aperture angle $\gamma$ and substrate size). Any point P on the substrate is characterized by an angle $\beta$ which is the angular distance between the radius containing P and the origin $\alpha$=0. This is also the angular coordinate of the mask position during its rotation when it just covers the point P. Angle $\beta$ varies from 0 to $\alpha_{max}$. Material starts to be deposited at t=$t_{min}$. "s" is defined as the time between $t_{min}$ and the time at which the mask starts its rotation, and represents a "dwell" period. In a first, single half cycle rotation embodiment, the mask rotation is assumed to be always in the same clockwise direction until it reaches the $\alpha_{max}$ position of complete substrate coverage at time t=$t_{max}$. At $t_{max}$, the mask stops its rotation and the process ends. In a second, single full cycle rotation embodiment, the mask, after reaching $\alpha_{max}$, starts rotating back in the counterclockwise direction, such that the substrate becomes exposed gradually starting from the $\beta$=$\alpha_{max}$ edge towards the $\beta$=0 edge. The process may end when the mask reaches the starting position or a time "s" afterwards. In a third rotation embodiment, the mask may repeat the full cycle an arbitrary number of times N. In alternative embodiments, the relative rotation of a single half cycle, a single full cycle or repeated full cycles may be achieved by the substrate rotating instead of the mask, or by both mask and substrate rotating.

Layer Thickness as Function of Position on the Substrate

A number of phenomena occurring in the geometric and dynamic configuration defined above in FIG. 4 are now discussed.

1. The deposited thickness at the left edge of the substrate h(0) is equal to 0 if s=0 and h(0)≠0 if s≠0. If the rotation is repeated N times back and forth and the requirement is for a final h(0)=0, then every time the mask reaches the $\alpha$=0 position the rotation must reverse immediately without delay from counterclockwise to clockwise. For simplicity and without loss of generality, we can assume s=0 and a total h(0)=0 at the end of the process. In fact, if h(0)=$h_0 \neq 0$, then this can be achieved simply by having the mask rest for a time s=$h_0$/(rN) every time the mask reaches the $\alpha$=0 position. $h_0$ in this case is a constant shift of the thickness function versus $\beta$ and we will ignore this situation from now on.

2. If we consider two points $P_1$ and $P_2$ characterized respectively by the two angles $\beta_1$ and $\beta_2$ such that $\beta_1 < \beta_2$ then h($\beta_1$) <h($\beta_2$). This is easily understood since the mask, in its clockwise travel from $\alpha$=0 covers $P_1$ at a time earlier than $P_2$ so that the amount of time $P_2$ is exposed to the film deposition is longer than the one $P_1$ is exposed. Conversely, in its counterclockwise travel back, the mask uncovers $P_2$ before $P_1$, again exposing $P_2$ for a longer period of time than $P_1$. As a consequence, the final layer thickness as function of position on the substrate h($\beta$) at the end of the process can only be a monotonously increasing function of $\beta$.

3. The period of time t($\beta$) during which a point P($\beta$) on the substrate is exposed to the film deposition during one half clockwise cycle rotation of the mask is equal to the time it takes the mask to reach the angle 13 from $\alpha$=0. If the mask position function $\alpha(t)$ describes the mask motion from $\alpha$=0 to $\alpha$=$\alpha_{max}$, then the exposure time of point P, t($\beta$), is that time at which $\alpha$=$\beta$ in the mask motion of the first half cycle. In addition, if the mask in its counterclockwise travel back follows (now $t_{max} < t < 2t_{max}$) the same position function in reverse, that is $\alpha(t)=\alpha(2t_{max}-t)$ till reaching the original position $\alpha$=0, then again P($\beta$) will be exposed for the same period of time t($\beta$) to the deposition stream. As a result, for each half cycle the total deposited thickness on point P is h($\beta$)=rt($\beta$), and if the full cycle is repeated N times the total thickness deposited on P at the end of the process is h($\beta$)=2Nrt($\beta$).

Figure 5:
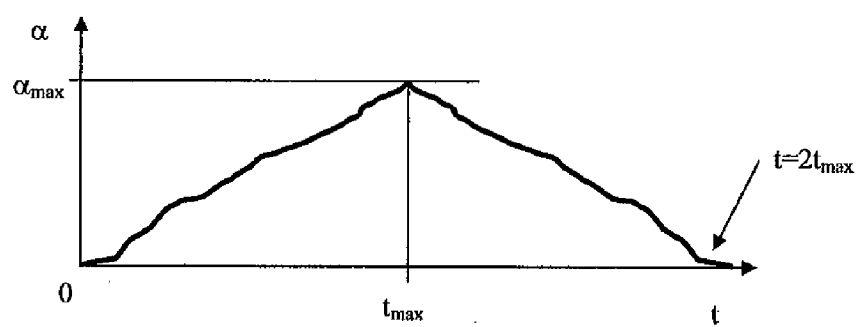
FIG. 5 shows an arbitrary function $\alpha(t)$ representing two half cycles of mask movement relative to the substrate as function of time t, clockwise for $0 < t < t_{max}$ and counterclockwise for $t_{max} < t < 2t_{max}$.

FIG. 5 shows an arbitrary function $\alpha(t)$ representing two half cycles of mask movement on the substrate, clockwise for $0 < t < t_{max}$, and counterclockwise for $t_{max} < t < 2t_{max}$.

The explanation above clarifies that if h($\beta$) is a required monotonically increasing film thickness function deposited on a substrate shaped in a section of circle, and this function varies along the circumference of the substrate and is equal to zero at one edge of the substrate, then:

a) The needed exposure time function t($\beta$) of any point P defined by the angle $\beta$ on the substrate for each half cycle of the mask movement is given by t($\beta$)=h($\beta$)/(2Nr) where N is the number of full cycles.

b) In each half cycle of mask movement, the time t at which the mask reaches the angle $\alpha$ is also the exposure time of point P at $\beta$=$\alpha$, so that the final result for the total deposited thickness h($\beta$) is h($\beta$)=2Nr*t($\beta$), where t($\beta$)=t($\alpha$) is the inverse function of the mask position $\alpha(t)$ shown in FIG. 2, between 0 and $t_{max}$.

Figure 6:
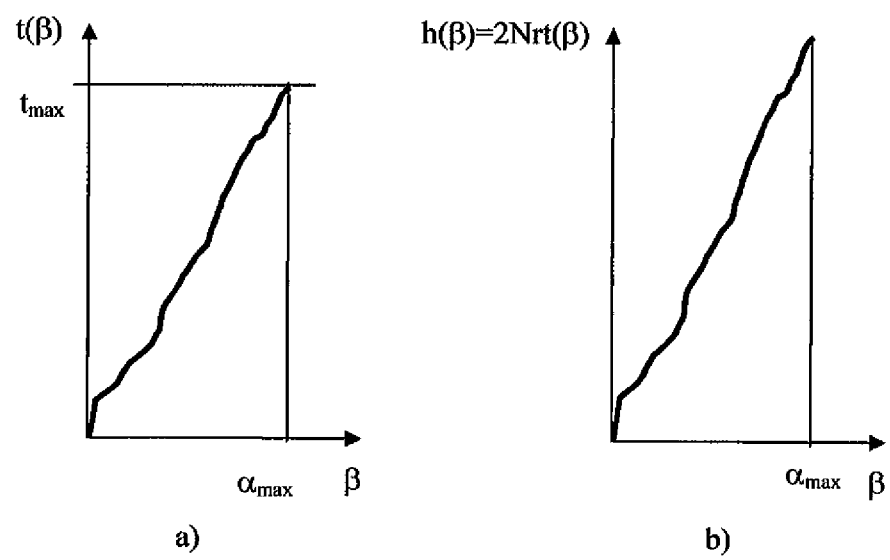
FIG. 6a shows the exposure time t for point P at angle $\beta$ in one half mask cycle of the movement in FIG. 5.
FIG. 6b shows the total thickness $h(\beta)$ after N cycles of the movement in FIG. 5.

FIG. 6 shows the final result for h($\beta$) in the case of mask movement of FIG. 5 with N repeated full cycles. In case the mask movement is only one half cycle, the factor 2N is absent. In (a), the exposure time t for point P at angle $\beta$ in one half mask cycle is the inverted function $\alpha^{-1}(t)$ of FIG. 5 with $\alpha$=$\beta$. In (b), the total thickness h($\beta$) is equal to the exposure time function shown in FIG. 6(a) multiplied by twice the number of full cycles and by the film deposition rate. In the case of only one half cycle mask movement, the factor 2N is absent.

Finally, working backwards, if h($\beta$) is the given arbitrary monotonous film thickness function of FIG. 6(b), is divided by 2Nr to give t($\beta$) of FIG. 6(a) and then inverted after setting $\beta$=$\alpha$, then the mask function a(t) of mask position versus time is obtained as required.

It should be noted that we have proved the existence of a mask movement as function of time which allows the production of any arbitrary monotonous film thickness function on a substrate using the mask configuration of FIG. 4; this does not mean that this mask time function is unique, but its existence ensures the practical feasibility of this invention. Many other thickness functions besides the ones mentioned here as examples can be produced with embodiments of the apparatus and method disclosed herein, without any physical changes in the apparatus.

Useful Film Thickness Functions

Figure 7:
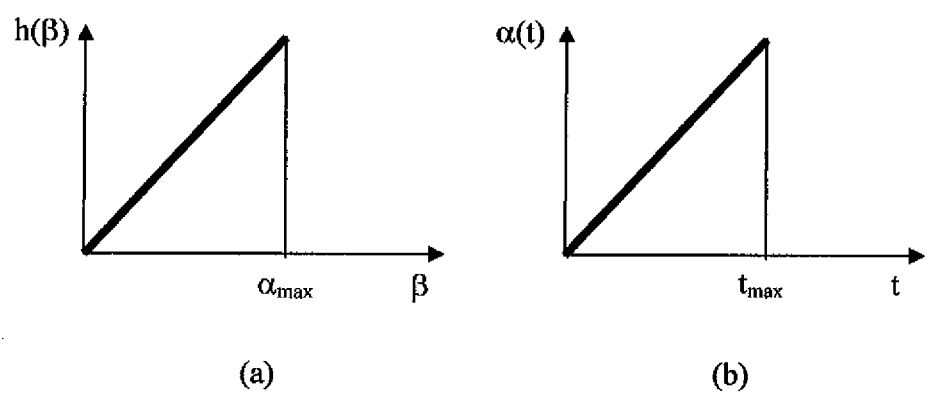
Figure 8:
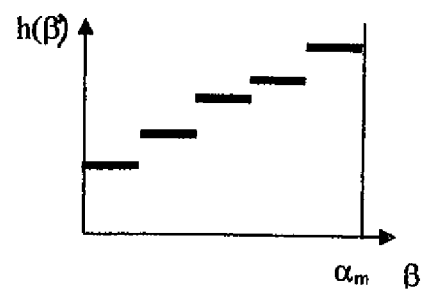
Figure 8:
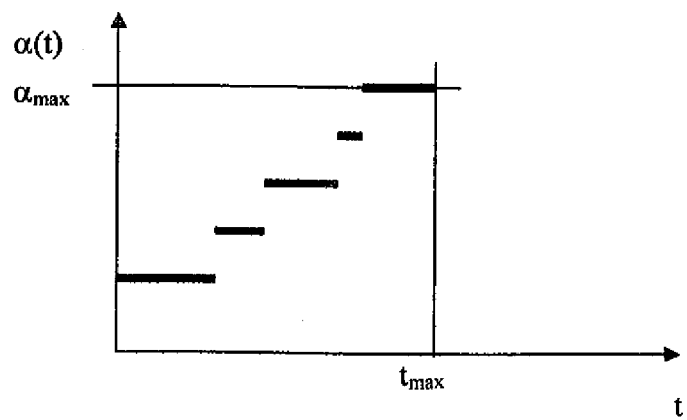

FIGS. 7 and 8 show exemplary useful film thickness functions achievable with the apparatus and method disclosed herein. FIG. 7a shows a linear thickness function, useful for the classic Circular Variable Filter (CVF) production. FIG. 7b shows the mask motion function $\alpha(t)$ for the linear example of FIG. 7a. FIG. 8a shows a stepwise thickness function for a number of discrete filters to be deposited on the substrate. FIG. 8b shows a mask motion function $\alpha(t)$ for the step wise example of FIG. 8a. Other possible monotonous functions may be quadratic, exponential, logarithmic, etc.

The basic ideas will hold for non-constant deposition rates with more complicated functional inversions. Small corrections may be needed in case the deposition rate is not exactly constant if the film thickness function is required to be very precisely reproduced according to its definition. However, most modern deposition chambers are believed to be well controlled with dedicated real time sensors to insure constant deposition rates, so this patent should cover most situations for all practical purposes. It should be readily understood that if the rate function is known in advance, the inversion can be mathematically prepared in advance. If not, deviations from constant deposition rate can be corrected by the controller program in real time by using the real time monitor indications.

In summary, embodiments of the invention allow to build AWC/CVF structures with any predetermined film thickness profile on a substrate using a single mask without changes in hardware and without the need to make any physical adjustments in the apparatus used from one run to another.

All publications, patents and patent applications mentioned in specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described with respect to a limited number of embodiments, it will be appreciated that many variations, modifications and other applications of the invention may be made.

The invention claimed is:

1. A coating tool for fabrication of an annular or a circular wedged coating on a substrate, the tool comprising:
   a) at least one deposition source;
   b) a planet carrier adapted to carry at least one substrate, the at least one substrate having a single mask associated therewith, the single mask having an aperture and positioned coaxially with the substrate in a substrate-single mask assembly;
   c) a first motor rotatably coupled to the planet carrier to impart the planet carrier a first rotation;
   d) a second motor rotatably coupled to the single mask and operative to impart the single mask a second rotation independent of the first rotation to enable a relative rotation between the single mask and the substrate around a common rotation axis, wherein the aperture is configured to allow material ejected from the at least one deposition source to reach a predetermined section of the substrate and be deposited thereon, and wherein the relative rotation is controllable to provide an annular or circular wedged coating on a substrate circumference; and e) a controller for controlling the relative rotation.

2. The coating tool of claim 1, wherein the mask is a butterfly mask.

3. The coating tool of claim 2, wherein the butterfly mask has two diametrically opposed apertures spanning an angle of 90 degrees.

4. The coating tool of claim 1, wherein the planet carrier is adapted to carry a plurality of substrates, each substrate having a single mask associated therewith, each mask having an aperture and positioned coaxially with its associated substrate to form a respective single substrate-single mask assembly and to enable the relative rotation and the deposition of material ejected from the at least one deposition source.

5. The coating tool of claim 1, wherein the controller is configured to control the relative rotation to follow a predetermined angular rate function versus time and wherein the annular or circular wedged coating has a monotonously increasing thickness around the substrate circumference.

6. The coating tool of claim 1, wherein the coupling of the second motor to the single mask is done through a mask pinion coupled to a master mask gear which is fixedly attached through a hollow shaft to a mask sun gear, the mask sun gear engaged with a final mask gear which rotates the single mask around the common axis.

7. The coating tool of claim 6, wherein the substrate is attached to a holder positioned on the planet carrier and coupled through a shaft to a planet gear which is engaged by a substrate sun gear fixedly attached to a substrate sun gear holder.

8. The coating tool of claim 7, wherein the final mask gear is fixedly attached to a hollow mask shaft mechanically coupled to the single mask and wherein the shaft coupling the substrate holder to the planet gear is positioned inside the hollow mask shaft and is coaxial with the hollow mask shaft along the common rotation axis.

9. An apparatus for fabrication of an annular or circular wedged coating on a substrate, comprising:

a) a coating chamber;

b) a coating tool positioned at least partially within the coating chamber and comprising
   i. at least one deposition source,
   ii. a planet carrier adapted to carry at least one substrate, the at least one substrate having a single mask associated therewith, the single mask having an aperture and positioned coaxially with the substrate in a substrate-single mask assembly,
   iii. a first motor rotatably coupled to the planet carrier to impart the planet carrier a first rotation; and
   iv. a second motor rotatably coupled to the single mask and operative to impart the single mask a second rotation independent of the first rotation to enable a relative rotation between the single mask and the substrate around a common rotation axis, wherein the aperture is configured to allow material ejected from the at least one deposition source to reach a predetermined section of the substrate and be deposited thereon, and wherein the relative rotation is controllable to provide an annular or circular wedged coating on a substrate circumference; and c) a controller for controlling the relative rotation.

10. The apparatus of claim 9, wherein the planet carrier is adapted to carry a plurality of substrates, each substrate having a single mask associated therewith, each mask having an aperture and positioned coaxially with its associated substrate in a respective substrate-single mask assembly such as to enable the relative rotation and the deposition of material ejected from the at least one deposition source.

11. The apparatus of claim 10, wherein the coupling of the second motor to the single mask is done through a mask pinion coupled to a master mask gear which is fixedly attached through a hollow shaft to a mask sun gear, the mask sun gear engaged with a final mask gear which rotates the single mask around the common rotation axis.

12. The apparatus of claim 11, wherein the substrate is attached to a holder positioned on the planet carrier and coupled through a shaft to a planet gear which is engaged by a substrate sun gear fixedly attached to a substrate sun gear holder.

13. The apparatus of claim 12, wherein the final mask gear is fixedly attached to a hollow mask shaft mechanically coupled to the mask and wherein the shaft coupling the substrate holder to the planet gear is positioned inside the hollow mask shaft and is coaxial with the hollow mask shaft along the common rotation axis.

14. The apparatus of claim 9, wherein the aperture is a single aperture with an angle of between 0 and 180 degrees or an aperture with two diametrically opposed aperture sections, each section having an angle of 90 degrees.

15. The apparatus of claim 9, wherein the controller is configured to control the relative rotation to follow a predetermined angular rate function versus time and wherein the annular or circular wedged coating has a monotonously increasing thickness around the substrate circumference.

* * * * *